(12) United States Patent
Ahn et al.

(10) Patent No.: US 11,693,155 B2
(45) Date of Patent: *Jul. 4, 2023

(54) ANTIREFLECTION HARD COATING FILM AND PREPARATION METHOD THEREOF

(71) Applicants: SK Innovation Co., Ltd., Seoul (KR); SK IE Technology Co., Ltd., Seoul (KR)

(72) Inventors: Jong Nam Ahn, Daejeon (KR); Tae Sug Jang, Daejeon (KR); Byoung Sun Ko, Daejeon (KR); Jin Su Park, Daejeon (KR); Ho Chul Yoon, Daejeon (KR)

(73) Assignees: SK Innovation Co., Ltd., Seoul (KR); SK ie technology Co., Ltd., Seoul (KR)

( * ) Notice: Subject to any disclaimer, the term of this patent is extended or adjusted under 35 U.S.C. 154(b) by 242 days.

This patent is subject to a terminal disclaimer.

(21) Appl. No.: 16/548,135

(22) Filed: Aug. 22, 2019

(65) Prior Publication Data
US 2020/0064519 A1 Feb. 27, 2020

(30) Foreign Application Priority Data

Aug. 23, 2018 (KR) .................. 10-2018-0098463
Aug. 16, 2019 (KR) .................. 10-2019-0100237

(51) Int. Cl.
*C09D 1/00* (2006.01)
*G02B 1/111* (2015.01)
(Continued)

(52) U.S. Cl.
CPC ............. *G02B 1/111* (2013.01); *C09D 1/00* (2013.01); *C09D 5/002* (2013.01); *C09D 5/006* (2013.01);
(Continued)

(58) Field of Classification Search
CPC .. G02B 1/111; G02B 1/14; G02B 1/18; G02B 1/11; G02B 1/115; C09D 1/00;
(Continued)

(56) References Cited

U.S. PATENT DOCUMENTS 9,706,649 B2 7/2017 Jung et al.
2001/0053438 A1* 12/2001 Nishida .............. G02B 1/111
428/212

(Continued)

FOREIGN PATENT DOCUMENTS

CN 102066464 A 5/2011
CN 106661380 A 5/2017
(Continued)

OTHER PUBLICATIONS

Machine translation of H11-258405, retrieved Nov. 23, 2021.*
(Continued)

*Primary Examiner* — Michael B Nelson
(74) *Attorney, Agent, or Firm* — The Webb Law Firm

(57) ABSTRACT

Provided is a hard coating film in which a hard coating layer having a water contact angle of 90° or less, a conductive layer, and a low refractive index layer are laminated on a substrate, the film having excellent hardness, anti-curling property, antireflection performance, antifouling performance, and antistatic performance.

10 Claims, 3 Drawing Sheets

(51) Int. Cl.
*G02B 1/14* (2015.01)
*G02B 1/18* (2015.01)
*C09D 5/00* (2006.01)
*C23C 14/34* (2006.01)
*C23C 14/00* (2006.01)
*C23C 14/06* (2006.01)
*C23C 14/08* (2006.01)
*C23C 14/10* (2006.01)
*C09D 183/06* (2006.01)

(52) U.S. Cl.
CPC ........ *C09D 183/06* (2013.01); *C23C 14/0036* (2013.01); *C23C 14/0694* (2013.01); *C23C 14/083* (2013.01); *C23C 14/10* (2013.01); *C23C 14/3464* (2013.01); *G02B 1/14* (2015.01); *G02B 1/18* (2015.01); *Y10T 428/31* (2015.01); *Y10T 428/31504* (2015.04); *Y10T 428/31511* (2015.04); *Y10T 428/31663* (2015.04); *Y10T 428/31678* (2015.04)

(58) Field of Classification Search
CPC ...... C09D 5/002; C09D 5/006; C09D 183/06; C09D 163/00; C09D 183/08; C09D 5/1675; C09D 5/1687; C09D 7/63; C23C 14/0036; C23C 14/0694; C23C 14/083; C23C 14/086; C23C 14/10; C23C 14/3464; B05D 7/04; B05D 2420/01; C08J 7/0423; C08J 7/046; C08J 2483/06; C08G 77/14; C08G 59/24; C08G 77/24; C08K 5/1515; C08K 5/372; C08L 83/06
See application file for complete search history.

(56) References Cited

U.S. PATENT DOCUMENTS

| | | | |
|---|---|---|---|
| 2009/0269504 | A1 | 10/2009 | Liao |
| 2010/0099805 | A1* | 4/2010 | Okuhira ................ C08L 63/00 524/261 |
| 2015/0376443 | A1 | 12/2015 | Chou et al. |
| 2018/0162989 | A1 | 6/2018 | Song et al. |
| 2020/0079910 | A1* | 3/2020 | Shibamoto ........... C08K 5/0025 |

FOREIGN PATENT DOCUMENTS

| | | | |
|---|---|---|---|
| CN | 107206756 A | | 9/2017 |
| CN | 107922620 A | | 4/2018 |
| JP | H11-258405 | * | 12/1999 |
| JP | 2008-122603 A | | 5/2008 |
| JP | WO 2016093270 | * | 12/2016 |
| JP | 2017-146456 A | | 8/2017 |
| KR | 10-1691376 | * | 12/2006 |
| KR | 1020110018069 A | | 2/2011 |
| KR | 1020130074167 A | | 7/2013 |
| KR | 101456220 B1 | | 11/2014 |
| KR | 1020160057221 A | | 5/2016 |
| KR | 1020180043687 A | | 4/2018 |

OTHER PUBLICATIONS

Machine translation of KR 10-1691376, retrieved Nov. 23, 2021.*
Machine translation of JPWO 2016093270, retrieved Nov. 23, 2021.*
Metal/Polymer Hybrids: Multiscale Adhesion Behaviour and Polymer Dynamics (Year: 2015).*
Refractive index of PMMA, retrieved Nov. 27, 2021.*

* cited by examiner

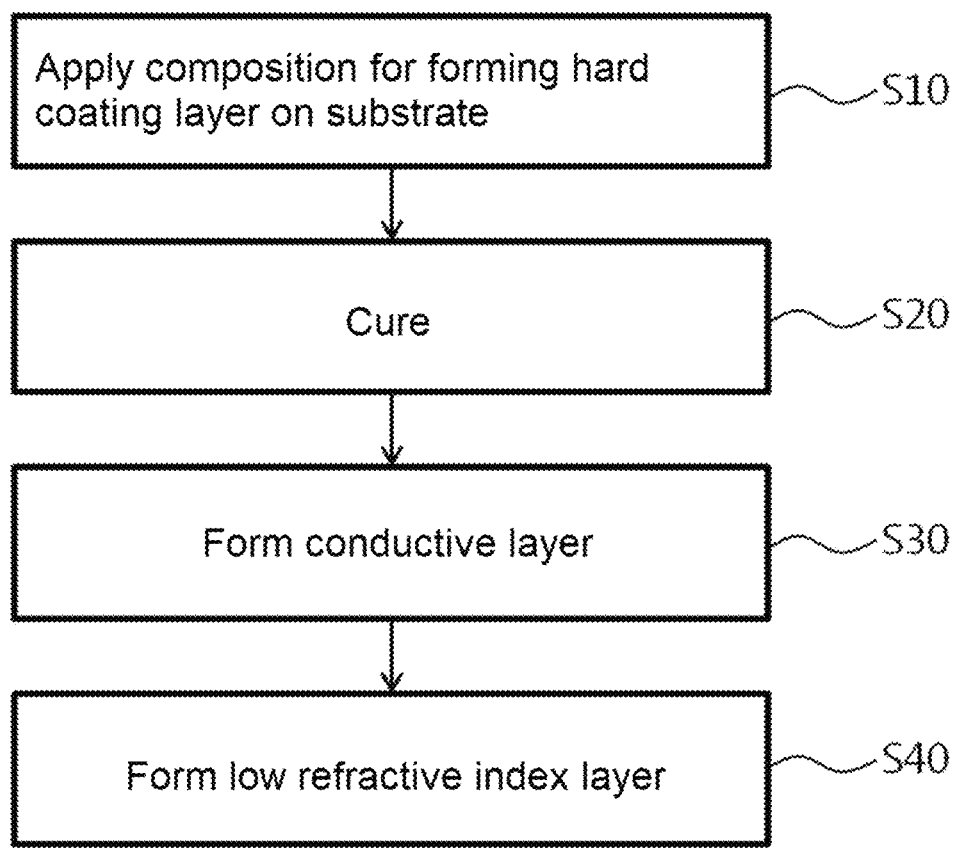

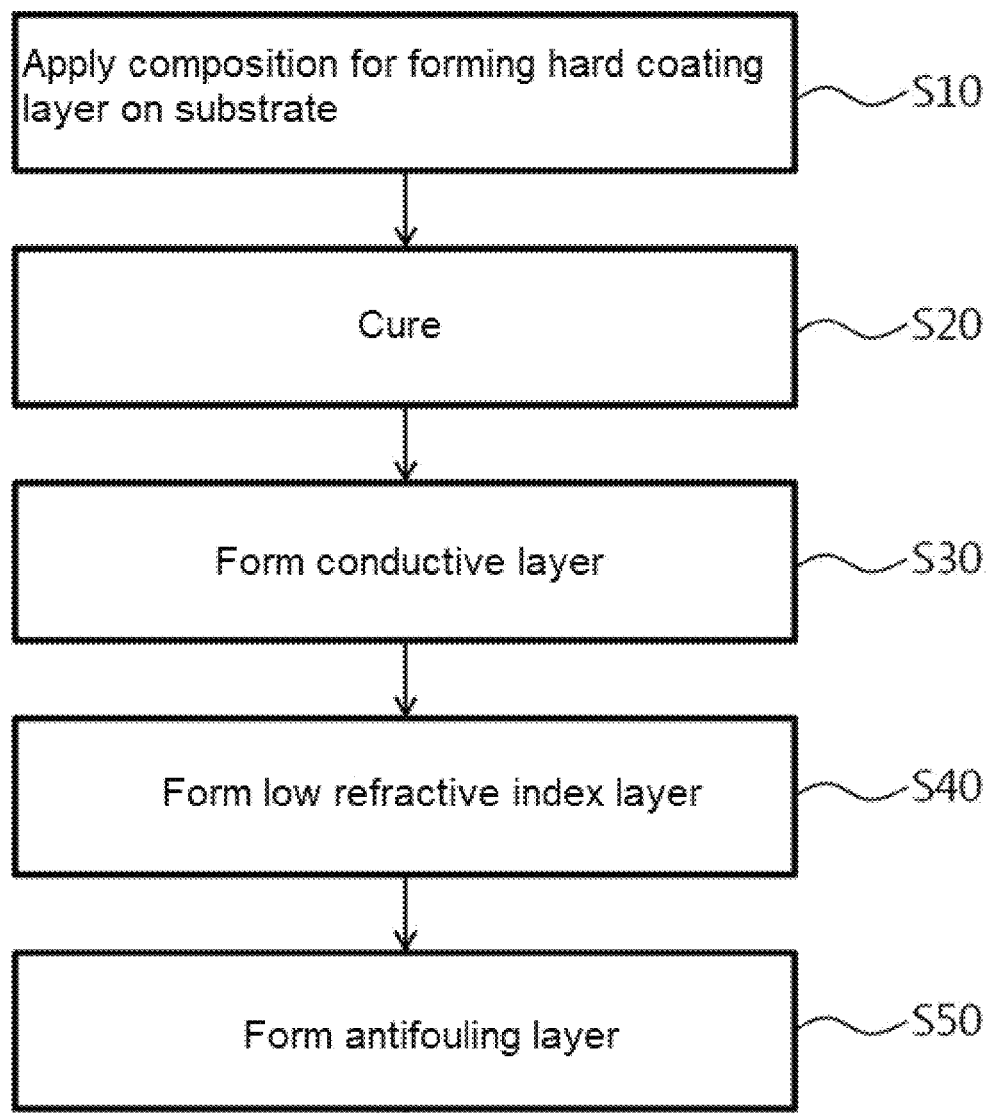

ANTIREFLECTION HARD COATING FILM AND PREPARATION METHOD THEREOF

CROSS-REFERENCE TO RELATED APPLICATIONS

This application claims priority to Korean Patent Application No. 10-2018-0098463 filed Aug. 23, 2018 and Korean Patent Application No. 10-2019-0100237 filed Aug. 16, 2019, the disclosures of which are incorporated herein by reference in their entirety.

TECHNICAL FIELD

The following disclosure relates to an antireflection hard coating film and a preparation method thereof.

BACKGROUND

Recently, thin displays using a flat panel display such as an organic light emitting diode display or a liquid crystal display are drawing attention. Particularly, these thin displays are implemented in the form of a touch screen panel and are widely used in various smart devices characterized by portability including various wearable devices as well as smart phones and tablet PCs.

These portable touch screen panel-based displays are provided with a window cover for display protection on a display panel for protecting the display panel from scratches or external impact, and in most cases, tempered glass for a display is used as a window cover. A tempered glass for a display is thinner than general glass, but is characterized by being manufactured to have high strength together with resistance to scratches.

However, the tempered glass has a disadvantage of being not suitable for weight reduction of portable devices due to its heavy weight, is vulnerable to external shock so that it is difficult to implement an unbreakable property, and does not bend above a certain level so that the tempered glass is unsuitable as a flexible display material having a bendable or foldable function.

Recently, various studies on an optical plastic cover securing flexibility and impact resistance simultaneously with having strength or scratch resistance corresponding to tempered glass have been conducted. In general, examples of optical transparent plastic cover materials having flexibility as compared with tempered glass may include polyethylene terephthalate (PET), polyether sulfone (PES), polyethylene naphthalate (PEN), polyacrylate (PAR), polycarbonate (PC), polyimide (PI), polyaramide (PA), polyamideimide (PAI), and the like.

However, these polymer plastic substrates exhibit insufficient physical properties in terms of hardness and scratch resistance and also does not have sufficient impact resistance, as compared with tempered glass used as a window cover for display protection. Thus, various attempts for complementing the required physical properties by coating a composite resin composition on these plastic substrates, have been made. As an example, a plastic substrate disclosed in Korean Patent Laid-Open Publication No. 10-2013-0074167 is included.

In the case of a general hard coating, a composition including a resin containing a photocurable functional group such as (meth)acrylate or epoxy, a curing agent or a curing catalyst, and other additives is used, but it is difficult to implement high hardness corresponding to the tempered glass, a curling phenomenon occurs a lot due to shrinkage at the time of curing, and also flexibility is insufficient, and thus, the general hard coating has a disadvantage of being not appropriate as a protective window substrate for being applied to a flexible display.

RELATED ART DOCUMENTS

Korean Patent Laid-Open Publication No. 10-2013-0074167

SUMMARY

An embodiment of the present invention is directed to providing an antireflection hard coating film having improved mechanical properties, hardness, anti-curling property, antistatic performance, antireflection performance, and the like.

Another embodiment of the present invention is directed to providing a preparation method of an antireflection hard coating film having improved mechanical properties, hardness, anti-curling property, antistatic performance, antireflection performance, and the like.

In one general aspect, an antireflection hard coating film includes: a substrate; a hard coating layer having a water contact angle of 90° or less, disposed on the substrate; a conductive layer disposed on the hard coating layer; and a low refractive index layer disposed on the conductive layer.

According to exemplary embodiments, the hard coating layer may include an epoxy siloxane resin, a thermal initiator including a compound represented by the following Chemical Formula 2, and a photoinitiator:

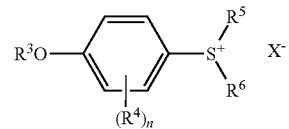

[Chemical Formula 2]

wherein $R^3$ is hydrogen, an alkoxycarbonyl group having 1 to 4 carbon atoms, an alkylcarbonyl group having 1 to 4 carbon atoms, or an arylcarbonyl group having 6 to 14 carbon atoms, $R^4$ is independently of each other hydrogen, halogen, or an alkyl group having 1 to 4 carbon atoms, n is 1 to 4, $R^5$ is an alkyl group having 1 to 4 carbon atoms or an aralkyl group having 7 to 15 carbon atoms which may be substituted by an alkyl group having 1 to 4 carbon atoms, $R^6$ is an alkyl group having 1 to 4 carbon atoms, and X is $SbF_6$, $PF_6$, $AsF_6$, $BF_4$, $CF_3SO_3$, $N(CF_3SO_2)_2$, or $N(C_6F_5)_4$.

In exemplary embodiments, the hard coating layer may be a cured layer of a composition for forming a hard coating layer including the epoxy siloxane resin, the thermal initiator including a compound represented by Chemical Formula 2, and the photoinitiator.

In some exemplary embodiments, the cured layer may be formed by photocuring and then thermally curing the composition for forming a hard coating layer.

In exemplary embodiments, the composition for forming a hard coating layer may further include a crosslinking agent including a compound represented by the following Chemical Formula 1:

[Chemical Formula 1]

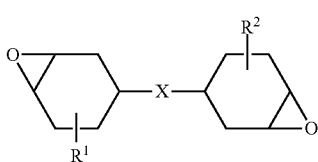

[Chemical Formula 2]

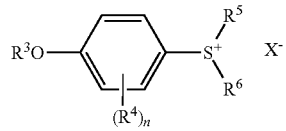

wherein $R^1$ and $R^2$ are independently of each other a linear or branched alkyl group having 1 to 5 carbon atoms, and X is a direct bond; a carbonyl group; a carbonate group; an ether group; a thioether group; an ester group; an amide group; a linear or branched alkylene group, alkylidene group, or alkoxylene group having 1 to 18 carbon atoms; a cycloalkylene group or cycloalkylidene group having 1 to 6 carbon atoms; or a connecting group thereof.

In exemplary embodiments, the conductive layer may include a conductive metal oxide or a conductive metal nitride.

In exemplary embodiments, the conductive metal oxide or the conductive metal nitride may include any one or more selected from the group consisting of an aluminum (Al) oxide doped with any one or more selected from the group consisting of phosphorus (P), indium (In), and antimony (Sb); a titanium (Ti) oxide doped with any one or more selected from the group consisting of phosphorus, indium, and antimony; and an antimony oxide doped with any one or more selected from the group consisting of phosphorus and indium.

In exemplary embodiments, the low refractive index layer may include an inorganic oxide.

In exemplary embodiments, the inorganic oxide may include silicon dioxide ($SiO_2$).

In exemplary embodiments, the antireflection hard coating film may have a surface resistance of $10^7 \Omega/\square$ to $10^{13} \Omega/\square$.

In exemplary embodiments, the conductive layer may have a refractive index of 1.6 to 2.6, and the low refractive index layer may have a refractive index of 1.35 to 1.45.

In exemplary embodiments, the hard coating layer may have a refractive index of 1.48 to 1.55.

In exemplary embodiments, when the conductive layer and the low refractive index layer are defined as an antireflection laminate, the antireflection laminate may be laminated two to six times repeatedly.

In exemplary embodiments, the antireflection hard coating film may further include an antifouling layer including a metal fluoride, disposed on the low refractive index layer.

In exemplary embodiments, the metal fluoride may include magnesium (Mg) or barium (Ba).

In another general aspect, a preparation method of the antireflection hard coating film includes: applying a composition for forming a hard coating layer including an epoxy siloxane resin, a thermal initiator including a compound represented by the following Chemical Formula 2, and a photoinitiator on a substrate; curing the composition for forming a hard coating layer to form a hard coating layer; forming a conductive layer on the hard coating layer; and forming a low refractive index layer on the conductive layer:

wherein $R^3$ is hydrogen, an alkoxycarbonyl group having 1 to 4 carbon atoms, an alkylcarbonyl group having 1 to 4 carbon atoms, or an arylcarbonyl group having 6 to 14 carbon atoms, $R^4$ is independently of each other hydrogen, halogen, or an alkyl group having 1 to 4 carbon atoms, n is 1 to 4, $R^5$ is an alkyl group having 1 to 4 carbon atoms or an aralkyl group having 7 to 15 carbon atoms which may be substituted by an alkyl group having 1 to 4 carbon atoms, $R^6$ is an alkyl group having 1 to 4 carbon atoms, and X is $SbF_6$, $PF_6$, $AsF_6$, $BF_4$, $CF_3SO_3$, $N(CF_3SO_2)_2$, or $N(C_6F_5)_4$.

In exemplary embodiments, the curing may include phorocuring and thermal curing which are sequentially performed.

In exemplary embodiments, the formation of the conductive layer may be performed by sputtering a conductive metal oxide or a conductive metal nitride or sputtering a metal element while supplying oxygen.

In exemplary embodiments, the conductive metal oxide or the conductive metal nitride may include any one or more selected from the group consisting of an aluminum (Al) oxide doped with any one or more selected from the group consisting of phosphorus (P), indium (In), and antimony (Sb); a titanium (Ti) oxide doped with any one or more selected from the group consisting of phosphorus, indium, and antimony; and an antimony oxide doped with any one or more selected from the group consisting of phosphorus and indium.

In exemplary embodiments, the formation of the low refractive index layer may be performed by sputtering an inorganic oxide.

In exemplary embodiments, the inorganic oxide may include silicon dioxide ($SiO_2$).

In exemplary embodiments, the preparation method of the antireflection hard coating film may further include forming an antifouling layer on the low refractive index layer.

In exemplary embodiments, the formation of the antifouling layer may be performed by sputtering a metal fluoride.

In exemplary embodiments, the metal fluoride may include magnesium (Mg) or barium (Ba).

Other features and aspects will be apparent from the following detailed description, the drawings, and the claims.

BRIEF DESCRIPTION OF THE DRAWINGS

FIGS. 4 and 5 are schematic flow charts representing a preparation method of an antireflection hard coating film according to the exemplary embodiments of the present invention.

DETAILED DESCRIPTION OF MAIN ELEMENTS

Figure 1:
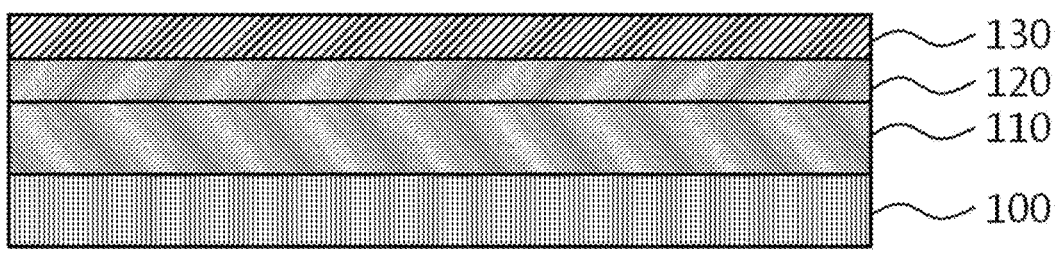
FIGS. 1, 2, and 3 are schematic drawings illustrating an antireflection hard coating film according to the exemplary embodiments of the present invention.

10: Antireflection hard coating film
100: Substrate
110: Hard coating layer
120: Conductive layer 125: Antireflection laminate
130: Low refractive index layer
140: Antifouling layer

DETAILED DESCRIPTION OF EMBODIMENTS

The advantages, features and aspects of the present invention will become apparent from the following description of the embodiments with reference to the accompanying drawings, which is set forth hereinafter. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The exemplary embodiments of the present invention provide an antireflection hard coating film in which a hard coating layer having a water contact angle of 90° or less, a conductive layer, and a low refractive index layer are laminated on a substrate, the film having suppressed curling and excellent hardness, antireflection performance, and antistatic performance. In addition, a preparation method of the antireflection hard coating film is provided.

Hereinafter, the exemplary embodiments of the present invention will be described in detail. However, these are only illustrative and the present invention is not limited to the specific embodiments which are illustratively described by the present invention.

The terms "curl" and "curling" used herein mean bending deformation of a film, and "curl amount" means a vertical height from the lowest point of the film to a point where the film is bent to be raised when a curled film is placed on a flat surface.

The term, "anti-curling property" used herein may refer to a characteristic of less exhibiting the "curl amount".

FIG. 1 is schematic drawings illustrating an antireflection hard coating film according to the exemplary embodiments of the present invention.

Referring to FIG. 1, the antireflection hard coating film 10 may include a substrate 100, a hard coating layer 110, a conductive layer 120, and a low refractive index layer 130.

The substrate 100, the hard coating layer 110, the conductive layer 120, and the low refractive index layer 30 may be laminated in this order with each layer being in direct contact with each other. In addition, another layer may be interposed between each layer.

It is preferred that the substrate 100 has excellent transparency, mechanical strength, thermal stability, moisture shielding property, isotropy, and the like. The substrate 100 may be manufactured from, for example, polyester-based resins such as polyethylene terephthalate, polyethylene isophthalate, and polybutylene terephthalate; cellulose-based resins such as diacetyl cellulose and triacetyl cellulose; polycarbonate-based resins; acrylic resins such as polymethyl (meth)acrylate and polyethyl (meth)acrylate; styrene-based resins such as a polystyrene acrylonitrile-styrene copolymer; polyolefin-based resin having a polyethylene, polypropylene, cyclo-based or norbornene structure, polyolefin-based resins such as an ethylenepropylene copolymer; polyimide-based resins; polyaramide-based resins; polyamideimide-based resins; polyethersulfone-based resins; sulfone-based resins, and the like. These resins may be used alone or in combination of two or more.

The thickness of the substrate 100 is not particularly limited, and for example, may be 10 to 250 μm.

The hard coating layer 110 may be disposed on the substrate 100.

In some exemplary embodiments, the hard coating layer 110 may have a water contact angle of 90° or less. When the hard coating layer 110 has a water contact angle of 90° or less, the surface tension of the hard coating layer 110 is high, so that interlayer bonding force between the hard coating layer 110 and the conductive layer 120 may be improved. In addition, the hard coating layer 110 and the conductive layer 120 may mutually prevent deformation, thereby suppressing a curling phenomenon of the entire antireflection hard coating film and improving durability. More preferably, the hard coating layer 110 may have a water contact angle of 80° or less or 50° or less, and 40° or more. In this case, the effect described above may be more increased.

The water contact angle of the hard coating layer 110 may be adjusted by adding a leveling agent to the composition for forming a hard coating layer described later, or performing physical treatment such as corona and plasma discharge. However, a method of adding a leveling agent to the composition for forming a hard coating layer may be more easily performed in the process.

In exemplary embodiments, the hard coating layer 110 may include an epoxy siloxane resin, a thermal initiator including a compound represented by the following Chemical Formula 2, and a photoinitiator:

[Chemical Formula 2]

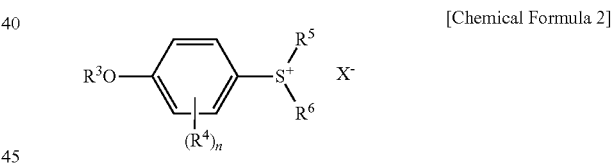

wherein $R^3$ is hydrogen, an alkoxycarbonyl group having 1 to 4 carbon atoms, an alkylcarbonyl group having 1 to 4 carbon atoms, or an arylcarbonyl group having 6 to 14 carbon atoms, $R^4$ is independently of each other hydrogen, halogen, or an alkyl group having 1 to 4 carbon atoms, n is 1 to 4, $R^5$ is an alkyl group having 1 to 4 carbon atoms or an aralkyl group having 7 to 15 carbon atoms which may be substituted by an alkyl group having 1 to 4 carbon atoms, $R^6$ is an alkyl group having 1 to 4 carbon atoms, and X is $SbF_6$, $PF_6$, $AsF_6$, $BF_4$, $CF_3SO_3$, $N(CF_3SO_2)_2$, or $N(C_6F_5)_4$.

The alkoxy portion of the alkoxycarbonyl group has 1 to 4 carbon atoms, and examples of the alkoxycarbonyl group may include a methoxycarbonyl group, an ethoxycarbonyl group, a propoxycarbonyl group, and the like.

The alkyl portion of the alkylcarbonyl group has 1 to 4 carbon atoms, and examples of the alkylcarbonyl group may include an acetyl group, a propionyl group, and the like.

The aryl portion of the arylcarbonyl group has 6 to 14 carbon atoms, and examples of the arylcarbonyl group may include a benzoyl group, a 1-naphthylcarbonyl group, a 2-naphthylcarbonyl group, and the like.

Examples of the aralkyl group may include a benzyl group, a 2-phenylethyl group, a 1-naphthylmethyl group, a 2-naphthylmethyl group, and the like.

In exemplary embodiments, the hard coating layer 110 may be formed by curing the composition for forming a hard coating layer including the epoxy siloxane resin, the thermal initiator including a compound represented by Chemical Formula 2, and the photoinitiator. That is, the hard coating layer 110 may be a cured layer of the composition for forming a hard coating layer.

The epoxy siloxane resin may be for example, a siloxane resin including an epoxy group. The epoxy group may be any one or more selected from the group consisting of a cyclic epoxy group, an aliphatic epoxy group, and an aromatic epoxy group. The siloxane resin may refer to a polymer compound in which a silicon atom and an oxygen atom form a covalent bond.

In some exemplary embodiments, the epoxy siloxane resin may be an epoxy group-substituted silsesquioxane resin. For example, the epoxy siloxane resin may be that in which the silicon atom of the silsesquioxane resin is directly substituted by an epoxy group or the substituent on the silicon atom is substituted by an epoxy group. As a non-limiting example, the epoxy siloxane resin may be a silsesquioxane resin substituted by a 2-(3,4-epoxycyclohexyl) ethyl group.

According to some exemplary embodiments, the epoxy siloxane resin may have a weight average molecular weight of 1,000 to 20,000, more preferably 1,000 to 18,000, and more preferably 2,000 to 15,000. When the weight average molecular weight is within the above range, the composition for forming a hard coating layer may have more appropriate density. Thus, the flowability, coatability, curing reactivity, and the like of the composition for forming a hard coating layer may be further improved. In addition, the hardness of the hard coating layer may be further improved and the flexibility of the hard coating layer is improved, thereby further suppressing occurrence of curling.

The epoxy siloxane resin according to the present invention may be prepared by alkoxysilane having an epoxy group alone or hydrolysis and condensation reactions of between alkoxysilane having an epoxy group and another kind of alkoxysilane, in the presence of water.

According to exemplary embodiments, alkoxysilane having the epoxy group used in the preparation of the epoxy siloxane resin may be exemplified by the following Chemical Formula 3:

   [Chemical Formula 3]

wherein $R^7$ is a linear or branched alkyl group having 1 to 6 carbon atoms substituted by an epoxycycloalkyl group having 3 to 6 carbon atoms or an oxiranyl group, in which the alkyl group may include an ether group, $R^8$ is a linear or branched alkyl group having 1 to 7 carbon atoms, and n is an integer of 1 to 3.

The alkoxysilane represented by the above Chemical Formula 3 is not particularly limited, and examples thereof may include 2-(3,4-epoxycyclohexyl)ethyltrimethoxysilane, 2-(3,4-epoxycyclohexyl)ethyltriethoxysilane, 3-glycidoxypropyltrimethoxysilane, and the like. These may be used alone or in combination of two or more.

In some exemplary embodiments, the epoxy siloxane resin may be included at 20 to 70 parts by weight, based on 100 parts by weight of the entire composition. More preferably, the linear epoxy siloxane compound may be included at 20 to 50 parts by weight, based on 100 parts by weight of the entire composition. When the above range is satisfied, the composition for forming a hard coating layer may secure better flowability and coating property. In addition, uniform curing is possible at the time of curing the composition for forming a hard coating layer to more effectively prevent physical defects such as cracks due to overcuring. In addition, the hard coating layer may exhibit better hardness.

The thermal initiator may form radicals, cations, or anions by heat and initiate polymerization of polymerizable compounds. The thermal initiator may promote the crosslinking reaction of the epoxy siloxane resin or the crosslinking agent described later when heat is applied to the composition for forming a hard coating layer.

In exemplary embodiments, the thermal initiator may include a compound represented by Chemical Formula 2. The compound of the following Chemical Formula 2 may be provided, for example, as a cationic thermal initiator. When the compound of the following Chemical Formula 2 is used as the thermal initiator, the curing half-life may be shortened. Accordingly, the thermal curing may be performed rapidly even under the low-temperature conditions, thereby preventing damage and deformation which occur in the case of long-term heat treatment under the high-temperature conditions.

In some exemplary embodiments, the thermal initiator may be included at 0.1 to 20 parts by weight, and more preferably 2 to 20 parts by weight, based on 100 parts by weight of the epoxy siloxane resin. When the content of the thermal initiator is within the range, the thermal curing reaction may proceed at a more effective speed. In addition, the contents of other components of the composition for forming a hard coating layer may be decreased to effectively prevent the mechanical properties (for example, hardness, flexibility, curling property) of the hard coating layer from being deteriorated.

In addition, for example, the thermal initiator may be included at 0.01 to 15 parts by weight, based on 100 parts by weight of the entire composition. More preferably, the photoinitiator may be included at 0.2 to 15 parts by weight, and still more preferably 0.5 to 10 parts by weight, based on 100 parts by weight of the entire composition.

According to some exemplary embodiments, the photoinitiator may include a photo-cationic initiator. The photo-cationic initiator may initiate polymerization of the epoxy siloxane resin and an epoxy-based monomer.

As the photo-cationic initiator, for example, an onium salt and/or an organic metal salt may be used, but the photo-cationic initiator is not limited thereto. For example, a diaryliodonium salt, a triarylsulfonium salt, an aryldiazonium salt, an iron-arene complex, and the like may be used. These may be used alone or in combination of two or more.

The content of the photoinitiator is not particularly limited, but for example, the photoinitiator may be included at 0.1 to 15 parts by weight, and more preferably 1 to 15 parts by weight, based on 100 parts by weight of the epoxy siloxane resin. When the content of the photoinitiator is within the above range, better curing efficiency of the composition for forming a hard coating layer may be maintained, and deterioration of the physical properties due to residual components after curing may be effectively prevented.

In addition, for example, the photoinitiator may be included at 0.01 to 10 parts by weight, based on 100 parts by weight of the entire composition. More preferably, the photoinitiator may be included at 0.1 to 10 parts by weight, and still more preferably 0.5 to 5 parts by weight, based on 100 parts by weight of the entire composition.

In exemplary embodiments, curing of the composition for forming a hard coating layer may be performed by photocuring or thermal curing. In addition, the curing may be performed by thermal curing after photocuring or photocuring after thermal curing, or photocuring and thermal curing may be performed simultaneously. However, in terms of the hardness and curling suppression of the hard coating layer 110, it is more preferred to perform thermal curing after photocuring.

In some exemplary embodiments, the photocuring using the photoinitiator may be used in combination with the thermal curing using the thermal initiator, thereby improving a curing degree, hardness, flexibility, and the like of the hard coating layer and decreasing curls.

For example, the composition for forming a hard coating layer is applied to a substrate or the like and is irradiated with ultraviolet rays (photocuring) to at least partially cure the composition, and then heat is further applied (thermal curing) to substantially completely cure the composition. Herein, the partial curing may be carried out until the pencil hardness of the cured layer by the ultraviolet curing becomes 1H.

That is, the composition for forming a hard coating layer may be semi-cured or partially cured by the photocuring. The semi-cured or partially cured composition for forming a hard coating layer may have a pencil hardness of about 1H. The semi-cured or partially cured composition for forming a hard coating layer may be substantially completely cured by the thermal curing.

For example, when the composition for forming a hard coating layer is cured only by photocuring, a curing time is excessively extended, or in part, curing may not be completely performed. However, when the photocuring is followed by the thermal curing, the portion which is not cured by the photocuring may be substantially completely cured by the thermal curing, and the curing time may be also reduced.

In addition, generally, a portion which is appropriately cured is provided with excessive energy due to an increase in the curing time (for example, an increase in light exposure time), so that overcuring may occur. When the overcuring proceeds, the cured layer may lose flexibility or mechanical defects such as curls or cracks may occur. However, the photocuring and the thermal curing are used in combination, the composition for forming a hard coating layer may be substantially completely cured within a short time. Thus, the hardness may be improved and occurrence of curling may be suppressed, while the flexibility of the hard coating layer is maintained.

According to some exemplary embodiments, the composition for forming a hard coating layer may further include a crosslinking agent. The crosslinking agent may form crosslinks with the epoxy siloxane resin to solidify the composition for forming a hard coating the cured layer and improve the hardness of the hard coating layer.

According to some exemplary embodiments, the crosslinking agent may include a compound having an alicyclic epoxy group. For example, the crosslinking agent may include a compound in which two 3,4-epoxycyclohexyl groups are connected. More specifically, for example, the crosslinking agent may include a compound represented by the following Chemical Formula 1. The crosslinking agent may have similar structure and characteristics to the epoxy siloxane resin. In this case, the crosslinking of the epoxy siloxane resin is promoted and the composition may be maintained at a proper density.

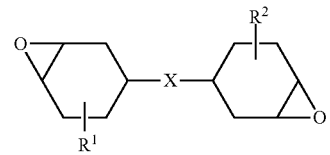

[Chemical Formula 1]

wherein $R^1$ and $R^2$ are independently of each other a linear or branched alkyl group having 1 to 5 carbon atoms, and X is a direct bond; a carbonyl group; a carbonate group; an ether group; a thioether group; an ester group; an amide group; a linear or branched alkylene group, alkylidene group, or alkoxylene group having 1 to 18 carbon atoms; a cycloalkylene group or cycloalkylidene group having 1 to 6 carbon atoms; or a connecting group thereof.

In the present specification, a "direct bond" refers to a structure which is directly bonded without any functional group. For example, in Chemical Formula 1, the direct bond refers to two cyclohexanes directly connected to each other. In addition, in the present invention, a "connecting group" refers to two or more substituents described above being connected to each other.

In addition, in Chemical Formula 1, the substitution positions of $R^1$ and $R^2$ are not particularly limited, but when the carbon connected to X is set at position 1, and the carbons connected to an epoxy group are set at positions 3 and 4, it is preferred that $R^1$ and $R^2$ are substituted at position 6.

The compound described above includes a cyclic epoxy structure in the molecule, and when the epoxy structure is formed in a linear shape as in Chemical Formula 1, the viscosity of the composition may be lowered to an appropriate range. When the viscosity is lowered, the coatability of the composition is improved and also the reactivity of the epoxy group is further improved, thereby promoting the curing reaction. In addition, crosslinks with the epoxy siloxane resin is formed to improve the hardness of the hard coating layer.

The content of the crosslinking agent according to the present invention is not particularly limited, and for example, may be 5 to 150 parts by weight, based on 100 parts by weight of the epoxy siloxane resin. When the content of the crosslinking agent is within the above range, the viscosity of the composition for forming a hard coating layer may be maintained in a more appropriate range, and coatability and curing reactivity may be further improved.

In addition, the crosslinking agent may be included at 3 to 30 parts by weight, based on 100 parts by weight of the entire composition. More preferably, the crosslinking agent may be included at 5 to 20 parts by weight, based on 100 parts by weight of the entire composition.

In some exemplary embodiments, the composition for forming a hard coating layer may further include a levelling agent.

As the levelling agent, an additive having an excellent leveling property and a high surface tension after curing may be used. For example, the leveling agent may include at least one selected from the group consisting of BYK310, BYK322, BYK325, BYK347, BYK3530, BYK3560, and BYK-LPG21241 from BYK Chemie GmbH; Tego Glide100, Tego Glide406, Tego Glide415, Tego Glide420, Tego Glide450, and Tego Glide B1484 from Evonik Industries AG; and the like.

The levelling agent may be included at 0.1 to 5 parts by weight, based on 100 parts by weight of the entire composition. In this case, occurrence of haze in the hard coating layer may be effectively prevented.

According to the exemplary embodiments, the composition for forming a hard coating layer may further include a thermal curing agent.

The thermal curing agent may include an amine-based curing agent, an imidazole-based curing agent, an acid anhydride-based curing agent, an amide-based thermal curing agents, and the like, and in terms of discoloration prevention and high hardness implementation, it is more preferred to further use an acid anhydride-based thermal curing agent. These may be used alone or in combination of two or more.

The content of the thermal curing agent is not particularly limited, and for example, may be 5 to 30 parts by weight, based on 100 parts by weight of the epoxy siloxane resin. When the content of the thermal curing agent is within the above range, the hardness efficiency of the composition for forming a hard coating layer may be further improved to form a hard coating layer having excellent hardness.

In some exemplary embodiments, the composition for forming a hard coating layer may further include a solvent. The solvent is not particularly limited and a solvent known in the art may be used.

Non-limiting examples of the solvent may include alcohol-based solvents (such as methanol, ethanol, isopropanol, butanol, methyl cellosolve, and ethyl cellosolve), ketone-based solvents (such as methyl ethyl ketone, methyl butyl ketone, methyl isobutyl ketone, diethyl ketone, dipropyl ketone, and cyclohexanone), hexane-based solvents (such as hexane, heptane, and octane), benzene-based solvents (such as benzene, toluene, and xylene), and the like. These may be used alone or in combination of two or more.

The content of the solvent is not particularly limited, and for example, may be 10 to 200 parts by weight, based on 100 parts by weight of the epoxy siloxane resin. When the above range is satisfied, the composition for forming a hard coating layer secures an appropriate level of viscosity, so that workability at the time of forming the hard coating layer may be better. In addition, it is easy to control the thickness of the hard coating layer, and the solvent drying time is reduced, thereby being capable of securing a more rapid process speed.

In addition, for example, the solvent may be included at a residual amount excluding the amount of the remaining components in the total weight of the predetermined entire composition. For example, when the total weight of the predetermined entire composition is 100 g and the sum of the weights of the remaining components excluding the solvent is 70 g, 30 g of the solvent may be included.

In some exemplary embodiments, the composition for forming a hard coating layer may further include an inorganic filler. The inorganic filler may improve the hardness of the hard coating layer.

The inorganic filler is not particularly limited, and examples thereof may include conductive metal oxides such as silica, alumina, and titanium oxide; hydroxides such as aluminum hydroxide, magnesium hydroxide, and potassium hydroxide; metal particles such as gold, silver, copper, nickel, and an alloy thereof; conductive particles such as carbon, carbon nanotubes, and fullerene; glass; ceramic; and the like. Preferably, silica may be used in terms of compatibility with other components of the composition for forming a hard coating layer. These may be used alone or in combination of two or more.

In some exemplary embodiments, the composition for forming a hard coating layer may further include a lubricant. The lubricant may improve winding efficiency, blocking resistance, wear resistance, scratch resistance, and the like.

The kind of the lubricants is not particularly limited, and for example, waxes such as polyethylene wax, paraffin wax, synthetic wax, or montan wax; synthetic resins such as a silicone-based resin or a fluorine-based resin; and the like may be used. These may be used alone or in combination of two or more.

In addition, the composition for forming a hard coating layer may further include additives such as, for example, an antioxidant, a UV absorber, a photostabilizer, a thermal polymerization inhibitor, a surfactant, a lubricant, and an antifouling agent.

The thickness of the hard coating layer 110 is not particularly limited, and for example, may be 5 to 100 µm, and more preferably 5 to 50 µm. When the thickness of the hard coating layer 110 is within the range, the hard coating layer maintains flexibility while having excellent hardness, so that curls may not substantially occur.

In some exemplary embodiments, the antireflection hard coating film 10 may have a curl amount of 5 mm or less, in which the curl amount is measured at each vertex of a square sample cut so that the length of each side is 10 cm and each side is inclined at an angle of 45° to an MD direction of the film.

The curl may refer to a vertical height from the lowest position (for example, a center) to the vertex of the film, for each vertex of the sample of the antireflection hard coating film cut into a square which is inclined at an angle of 45° to the MD direction and has each side of 10 cm in length. In the present specification, the MD direction is a machine direction, and refers to a direction in which the film moves along an automated machine when the film is drawn or laminated by an automation process. As the curl is measured for the sample inclined at the angle of 45° to the MD direction, the curls at each vertex means curls to the MD direction and a direction perpendicular to the MD direction, thereby distinguishing the curls.

In some exemplary embodiments, the hard coating layer 110 may have a refractive index of 1.48 to 1.55.

According to some exemplary embodiments, the hard coating layer 110 may be formed on one surface of the substrate 100, or the hard coating layer 110 may be formed on both surfaces of the substrate 100.

The conductive layer 120 is disposed on a surface opposite to the side where the substrate 100 of the hard coating layer 110 is positioned.

The conductive layer 120 may impart an antistatic property to the antireflection hard coating film 10.

The conductive layer 120 may adopt and include any material without limitation, as long as the material may impart an antistatic property to the antireflection hard coating film 10.

However, the material included in the conductive layer 120 may be a material having high light transmittance and refractive index. In this case, the antireflection property may be implemented by a difference in a refractive index between the conductive layer 120 and the low refractive index layer 130.

In some exemplary embodiments, the conductive layer 120 may include a conductive metal oxide or a conductive metal nitride.

Hereinafter, for convenience of description, description will be given based on the conductive metal oxide. The following description for the conductive metal oxide may correspond to the conductive metal nitride.

The conductive metal oxide may mean that it includes a conductive metalloid oxide.

The conductive metal oxide may mean that it includes a metal oxide having conductivity in itself. Of course, those doped with impurities may be included. The impurities may be, for example, a non-metal element, a metalloid element, a metal element, and the like.

In addition, the conductive metal oxide may mean that a metal oxide having conductivity by doping with impurities is included. The impurities may be, for example, a non-metal element, a metalloid element, a metal element, and the like.

In some exemplary embodiments, the conductive metal oxide or the conductive metal nitride may include any one or more selected from the group consisting of an aluminum (Al) oxide doped with any one or more selected from the group consisting of phosphorus (P), indium (In), antimony (Sb), and the like; a titanium (Ti) oxide doped with any one or more selected from the group consisting of phosphorus, indium, antimony, and the like; an antimony oxide doped with any one or more selected from the group consisting of phosphorus, indium, and the like; and the like. In this case, the antireflection hard coating film may secure excellent antistatic performance and antireflection performance.

For example, a titanium oxide doped with phosphorus, indium, or antimony may have electroconductivity. In addition, phosphorus, indium, or antimony may stabilize the titanium oxide and reinforce strength of the titanium oxide. In particular, the titanium oxide doped with phosphorus, indium, or antimony may have high transparency and refractive index. Thus, the antireflection hard coating film may secure particularly excellent antistatic performance and antireflection performance.

In some exemplary embodiments, the conductive layer 120 may be formed of a single material of the conductive metal oxide or the conductive metal nitride.

According to some exemplary embodiments, the conductive layer 120 may be formed by sputtering the conductive metal oxide or the conductive metal nitride. In addition, the conductive layer 120 may be formed by sputtering a metal element while supplying oxygen. In this case, the conductive layer 120 may have a uniform and small thickness, and have better hardness and light transmission, as compared with the film formed by wet-drying the solvent. In addition, more improved antireflection and antistatic effects may be implemented.

In some exemplary embodiments, the refractive index of the conductive layer 120 may be higher than the refractive indexes of the hard coating layer 110 and the low refractive index layer 130.

In some exemplary embodiments, the conductive layer 120 may have a refractive index of 1.6 to 2.6.

In some exemplary embodiments, the antireflection hard coating film may have a surface resistance of $10^7 \Omega/\square (\Omega/sq)$ to $10^{13} \Omega/\square$, and more preferably $10^8 \Omega/\square$ to $10^{11} \Omega/\square$.

The low refractive index layer 130 is disposed on a surface opposite to the side where the hard coating layer 110 of the conductive layer 120 is positioned. The refractive index of the low refractive index layer 130 may be lower than the refractive index of the conductive layer 120.

In some exemplary embodiments, the low refractive index layer 130 may include an inorganic oxide. As the inorganic oxide, a material having a high light transmittance and a refractive index lower than the refractive index of the conductive metal oxide or the conductive metal nitride of the conductive layer 120, may be used.

The inorganic oxide may be an oxide of a metalloid element.

For example, the inorganic oxide may include silicon dioxide ($SiO_2$) and the like. The silicon dioxide has a refractive index lower than the refractive index of the conductive metal oxide or the conductive metal nitride of the conductive layer 120 and a sufficient light transmission, and thus, may be appropriate for an antireflective coating.

In some exemplary embodiments, the low refractive index layer 130 may be formed of a single material of the inorganic oxide.

According to some exemplary embodiments, the low refractive index layer 130 may be formed by sputtering the inorganic oxide. In this case, the low refractive index layer 130 may have a uniform and small thickness, and have better hardness, as compared with the film formed by wet-drying the solvent. In addition, a purity may be high without impurities such as solvent residues, and light transmission may be better. In addition, a more improved antireflection effect may be implemented.

In some exemplary embodiments, the low refractive index layer 130 may have a refractive index of 1.35 to 1.45.

Figure 2:
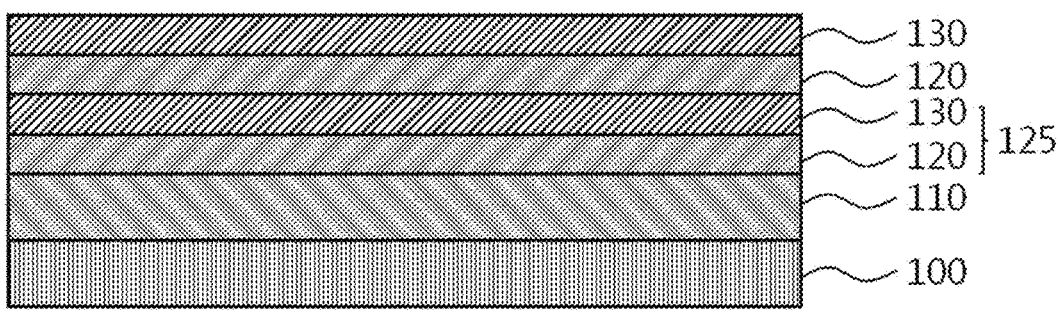

FIG. 2 is schematic drawings illustrating an antireflection hard coating film according to the exemplary embodiments of the present invention.

Referring to FIG. 2, in some exemplary embodiments, the conductive layer 120 and the low refractive index layer 130 may be defined as an antireflection laminate 125, and the antireflection laminate 125 may be laminated several times repeatedly.

In the antireflection laminate 125, the antireflection effect of light incident on the low refractive index layer 130 may be implemented by a difference in a refractive index between the conductive layer 120 and the low refractive index layer 130.

In exemplary embodiments, the antireflection laminate 125 may be laminated two to six times repeatedly. In this case, an excellent antireflection effect may be implemented. In addition, a decrease in a light transmittance and a decrease in visibility to a lower surface of the antireflection hard coating film may be effectively prevented.

Figure 3:
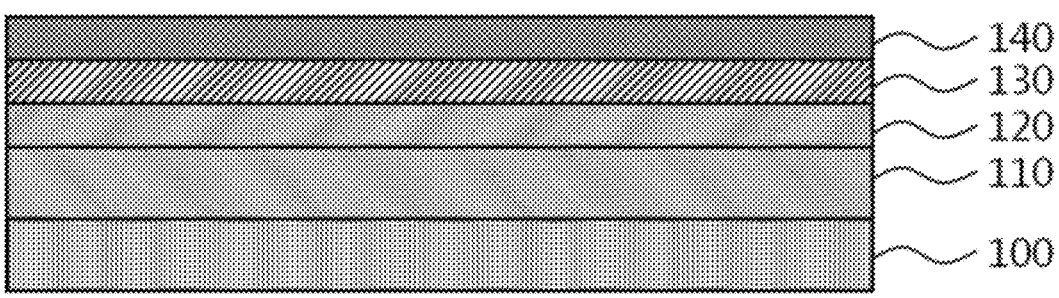

FIG. 3 is schematic drawings illustrating an antireflection hard coating film according to the exemplary embodiments of the present invention.

Referring to FIG. 3, the antireflection hard coating film according to the exemplary embodiments of the present invention may further include an antifouling layer 140 disposed on the low refractive index layer 130.

In some exemplary embodiments, the antifouling layer 140 may include a metal fluoride. In this case, the antifouling layer 140 may secure water repellent, water-proof, and oil-proof performances.

In some exemplary embodiments, the metal fluoride may include magnesium (Mg), barium (Ba), and the like. In this case, the antifouling layer 140 may secure particularly excellent light transmission and water repellency.

In some exemplary embodiments, the antifouling layer 140 may be formed of a single material of the metal fluoride.

In some exemplary embodiments, the antifouling layer 140 may be formed by sputtering the metal fluoride. In this case, the antifouling layer 140 may have a uniform and small thickness, as compared with the film formed by wet-drying the solvent. In addition, a purity may be high without impurities such as solvent residues, and light transmission may be better. In addition, better scratch resistance and antifouling performance may be exhibited.

In some exemplary embodiments, the antifouling layer 140 may have a refractive index of 1.30 to 1.60.

FIG. 4 is schematic flow charts representing a preparation method of a hard coating film according to the exemplary embodiments of the present invention.

According to exemplary embodiments, a composition for forming a hard coating layer may be applied on a substrate (for example, S10).

As the composition for forming a hard coating layer, the composition for forming a hard coating layer according to the above-described exemplary embodiments of the present invention may be used.

The application (for example, S10) may be carried out by a die coater, an air knife, a reverse roll, spray, a blade, casting, gravure, spin coating, and the like.

According to some exemplary embodiments, the composition for forming a hard coating layer may be cured to form a hard coating layer (for example, S20).

In exemplary embodiments, curing of the composition for forming a hard coating layer may be performed by photocuring, or also performed by thermal curing. In addition, the curing may be performed by thermal curing after photocuring or photocuring after thermal curing, or photocuring and thermal curing may be performed simultaneously. However, in terms of the hardness and curling suppression of the hard coating layer, it is more preferred to perform thermal curing after photocuring. The photocuring may be performed by ultraviolet irradiation.

The composition for forming a hard coating layer may be at least partially photocured by the ultraviolet irradiation.

In exemplary embodiments, the ultraviolet irradiation may be carried out so that a curing degree of the composition for forming a hard coating layer is about 20 to 80%. When the curing degree is within the range, the hard coating layer is primarily cured to secure hardness, and simultaneously prevents an overcuring phenomenon due to an extended light exposure time.

For example, the ultraviolet irradiation may be carried out so that a pencil hardness of the cured hard coating layer is 1H or less. That is to say, the ultraviolet irradiation is finished before the pencil hardness of the hard coating layer becomes about 1H, and the thermal curing may be carried out.

For example, heat is applied to the hard coating layer composition which has been primarily partially cured by ultraviolet irradiation to substantially completely cure the composition. When the photocuring and the thermal curing having different curing mechanisms are used in combination, the curing time is shortened as compared with the case in which the photocuring or the thermal curing is carried out alone for curing, thereby suppressing the overcuring phenomenon. In addition, the crosslinking reaction is effectively derived to allow the crosslinks to be uniformly formed. In addition, the hard coating layer may maintain flexibility while having improved hardness, and curls of the antireflection hard coating film may be significantly decreased.

In some exemplary embodiments, the thermal curing may be carried out at a temperature of 100 to 200° C. for 5 to 20 minutes. More preferably, the thermal curing may be carried out at a temperature of 120 to 180° C. Within the temperature range, the thermal curing may proceed at a more effective speed. In addition, crack occurrence due to thermal decomposition or a side reaction of each component in the composition for forming a hard coating layer or overcuring of the hard coating layer may be effectively prevented.

According to exemplary embodiments, pretreatment may be carried out by heating the composition for forming a hard coating layer before ultraviolet irradiation. In the pretreatment process, a solvent having high volatility may be evaporated before ultraviolet irradiation. Thus, occurrence of air bubbles or non-uniform curing during ultraviolet irradiation may be prevented.

The pretreatment may be carried out at lower temperature than the thermal curing temperature, and for example, carried out at 40 to 80° C. Within the temperature range, the solvent may be effectively evaporated while the initiation reaction of the thermal initiator does not occur.

According to exemplary embodiments, the conductive layer is formed on the hard coating layer (for example, S30).

In some exemplary embodiments, the formation of the conductive layer may be performed by sputtering a conductive metal oxide or conductive metal nitride or sputtering a metal element while supplying oxygen.

In some exemplary embodiments, the conductive metal oxide or the conductive metal nitride may include any one or more selected from the group consisting of an aluminum (Al) oxide doped with any one or more selected from the group consisting of phosphorus (P), indium (In), antimony (Sb), and the like; a titanium (Ti) oxide doped with any one or more selected from the group consisting of phosphorus, indium, antimony, and the like; an antimony oxide doped with any one or more selected from the group consisting of phosphorus, indium, and the like; and the like.

In some exemplary embodiments, the conductive layer may be formed of only the conductive metal oxide or the conductive metal nitride.

According to exemplary embodiments, the low refractive index layer is formed on the conductive layer (for example, S40).

In some exemplary embodiments, the formation of the low refractive index layer may be performed by sputtering an inorganic oxide.

In some exemplary embodiments, the inorganic oxide may include silicon dioxide ($SiO_2$) and the like.

In some exemplary embodiments, the low refractive index layer may be formed of only the inorganic oxide.

Formation of the conductive layer and formation of the low refractive index layer may be performed several times repeatedly, and the formation is performed to be completed by the formation of the low refractive index layer.

FIG. 5 is schematic flow chart representing a preparation method of an antireflection hard coating film according to the exemplary embodiments of the present invention.

Hereinafter, referring to FIG. 5, the preparation method of the antireflection hard coating film according to the exemplary embodiments of the present invention will be described. However, detailed description may be omitted for the same process as the process described above referring to FIG. 4.

According to exemplary embodiments, an antifouling layer may be formed on the low refractive index layer (for example, S50). In this case, an antireflection hard coating film having improved scratch resistance, water contact angle, and antifouling performance may be prepared.

In some exemplary embodiments, formation of the antifouling layer may be performed by sputtering a metal fluoride.

In some exemplary embodiments, the metal fluoride may include magnesium (Mg), barium (Ba), and the like.

In some exemplary embodiments, the antireflection hard coating film 10 has a high surface hardness and excellent flexibility, and is thinner and has better impact resistance than a tempered glass, and thus, may be preferably used as a window substrate of the outermost surface of the display panel.

According to some exemplary embodiments, an image display including the antireflection hard coating film 10 may be provided.

The antireflection hard coating film 10 may be used as a window substrate of the outermost surface of the image display. The image display may be various image displays such as a common liquid crystal display, an electroluminescence display, a plasma display, and a field emission display.

Hereinafter, preferred examples will be provided in order to assist in the understanding of the present invention. However, it will be obvious to those skilled in the art that these examples only illustrate the present invention and do not limit the appended claims, and various modifications and alterations of the examples may be made within the range of the scope and spirit of the present invention, and these modifications and alterations will fall within the appended claims.

Preparation Example 1

2-(3,4-Epoxycyclohexyl)ethyltrimethoxysilane (ECTMS, TCI Co., Ltd.) and water ($H_2O$, Sigma-Aldrich Corporation) were mixed at a ratio of 24.64 g:2.70 g (0.1 mol:0.15 mol) and placed in a 250 mL 2-neck flask. Thereafter, 0.1 mL of a tetramethylammonium hydroxide catalyst (Sigma-Aldrich) and 100 mL of tetrahydrofuran (Sigma-Aldrich) were added to the mixture and stirred at 25° C. for 36 hours. Then, layer separation was performed and a product layer was extracted with methylene chloride (Sigma-Aldrich), and moisture was removed from the extract with magnesium sulfate (Sigma-Aldrich) and the solvent was dried under vacuum to obtain an epoxy siloxane resin. As a result of measuring the epoxy siloxane resin using gel permeation chromatography (GPC), the weight average molecular weight was 2500.

Example 1

30 parts by weight of the epoxy siloxane resin prepared in Preparation Example 1, 15 parts by weight of (3',4'-epoxycyclohexyl)methyl 3,4-epoxycyclohexanecarboxylate (Daicel Corporation, Celloxide 2021P), 1 part by weight of 4-acetoxyphenyldimethylsulfonium hexafluoroantimonate (SANSHIN CHEMICAL INDUSTRY CO., LTD., SI-60), 1 part by weight of (4-methylphenyl) [4-(2-methylpropyl) phenyl]iodonium hexafluorophosphate, 0.3 parts by weight of a silicone polymer (BYK Additives & Instruments, BYK3560, a levelling agent), and 52.7 parts by weight of methyl ethyl ketone (Sigma-Aldrich) were mixed to prepare a composition for forming a hard coating layer.

The composition for forming a hard coating layer was applied on a colorless polyimide (cPI) film having a thickness of 80 μm by a Meyer bar method, and was allowed to stand at a temperature of 60° C. for 5 minutes.

The applied composition was irradiated with UV at 1 J/cm² using a high-pressure metal lamp and then was cured at a temperature of 120° C. for 15 minutes to form a hard coating layer having a thickness of 10 μm, a refractive index of 1.51, and a water contact angle of 79°.

Titanium dioxide ($TiO_2$) doped with indium (In) was sputtered on the upper surface of the hard coating layer to form a conductive layer having a refractive index of 2.0.

$SiO_2$ was sputtered on the upper surface of the conductive layer to form a low refractive index layer having a refractive index of 1.45, thereby preparing an antireflection hard coating film.

Example 2

An antireflection hard coating film was prepared in the same manner as in Example 1, except that the conductive layer was replaced with the conductive layer having a refractive index of 2.5, formed by sputtering titanium dioxide doped with antimony (Sb).

Example 3

An antireflection hard coating film was prepared by forming the conductive layer and the low refractive index layer once more repeatedly on the low refractive index layer in Example 1.

Example 4

An antireflection hard coating film was prepared by forming the conductive layer and the low refractive index layer two times more repeatedly on the low refractive index layer in Example 1.

Example 5

In Example 1, the conductive layer and the low refractive index layer were formed two times more repeatedly on the low refractive index layer.

Thereafter, $MgF_2$ was sputtered on the upper surface of the outermost layer to form an antifouling layer having a refractive index of 1.38, thereby preparing an antireflection hard coating film.

Comparative Example 1

An antireflection hard coating film was prepared in the same manner as in Example 1, except that the conductive layer was replaced with the high refractive index layer having a refractive index of 2.0, formed by sputtering hafnium dioxide ($HfO_2$).

Comparative Example 2

20 parts by weight of pentaerythritol tetraacrylate, 20 parts by weight of o-phenylphenoxyethyl acrylate, 1 part by weight of 1-hydroxylcyclohexyl phenyl ketone, 0.3 parts by weight of a silicone polymer (BYK Additives & Instruments, BYK300, a levelling agent), and 58.7 parts by weight of methyl ethyl ketone (Sigma-Aldrich) were mixed to prepare a hard coating composition of the Comparative Example.

The hard coating composition was applied on a cPI film having a thickness of 80 μm by a Meyer bar method, and was allowed to stand at a temperature of 60° C. for 5 minutes.

The applied composition was irradiated with UV at 1 J/cm² using a high pressure metal lamp to form a hard coating layer having a thickness of 10 μm and a refractive index of 1.54.

Titanium dioxide doped with indium was sputtered on the upper surface of the hard coating layer to form a conductive layer having a refractive index of 2.0.

SiO$_2$ was sputtered on the upper surface of the conductive layer to form a low refractive index layer having a refractive index of 1.45, thereby preparing an antireflection hard coating film.

Comparative Example 3

An antireflection hard coating film was prepared in the same manner as in Example 2, except that the conductive layer was replaced with the high refractive index layer having a refractive index of 2.0, formed by sputtering hafnium dioxide (HfO$_2$).

Experimental Example

The pencil hardness, the curl amount, the reflectance, the transmittance, and the antistatic property of the antireflection hard coating films of the Examples and the Comparative Examples were evaluated.

In addition, interlayer bonding force between the hard coating layer and the layers formed on the hard coating layer of the Examples and the Comparative Examples were evaluated.

The water contact angle of the hard coating layers of the Examples and the Comparative Examples were measured using a contact angle measuring instrument (MSA, KRUSS GmbH), before forming other layers.

3. Measurement of Reflectance

A spectrophotometer UV3600 (Shimadzu Corporation) was equipped with an adaptor MPC603, a specular reflectance to an output angle of 5° at an incident angle of 5° in a wavelength range of 380 to 780 nm was measured, and an average reflectance of 400 to 800 nm was calculated.

4. Measurement of Transmittance

The total transmittance of the antireflection hard coating film was measured using a spectrophotometer (COH-400, Nippon Denshoku Industries, Co., Ltd).

5. Measurement of Antistatic Property

On three points on the surface of the outermost layer of the antireflection hard coating film, the surface resistance was measured at 500 V for 10 seconds, using a high resistivity meter (MCP-HT800/MITSUBISHI CHEMICAL ANALYTECH) and a probe (URS, UR 100).

6. Evaluation of Interlayer Bonding Force

The antireflection hard coating film was cut into a size of 7 cm×12 cm and fixed to a jig of a wear resistance tester (manufactured by Kipae E&T Co. Ltd.), and steel wool (#0000, Liberon Limited) was provided in and fixed to a tip having a diameter of 22 mm. A moving distance of 100 mm, a moving speed of 60 mm/min, and a load of 1.0 kg were set, and the surface of the outermost layer of the antireflection hard coating film was rubbed with steel wool 10 times reciprocatively. Thereafter, it was confirmed whether exfoliation between the hard coating layer and the layers formed on the hard coating layer occurred (bonding force).

TABLE 1

| Classification | Pencil hardness | Curl amount | Water contact angle of hard coating layer | Reflectance (%) | Transmittance (%) | Surface roughness | Bonding force |
|---|---|---|---|---|---|---|---|
| Example 1 | 8H | 0.5 mm | 79 | 0.5 | 94.3 | 10$^9$ Ω/cm$^2$ | Not exfoliated |
| Example 2 | 8H | 0.5 mm | 78 | 0.4 | 94.6 | 10$^9$ Ω/cm$^2$ | Not exfoliated |
| Example 3 | 8H | 0.5 mm | 80 | 0.3 | 94.7 | 10$^9$ Ω/cm$^2$ | Not exfoliated |
| Example 4 | 8H | 0.5 mm | 80 | 0.2 | 94.8 | 10$^9$ Ω/cm$^2$ | Not exfoliated |
| Example 5 | 8H | 0.5 mm | 79 | 0.3 | 94.8 | 10$^9$ Ω/cm$^2$ | Not exfoliated |
| Comparative Example 1 | 8H | 3 mm | 79 | 0.8 | 93.2 | Unmeasurable | Not exfoliated |
| Comparative Example 2 | 3H | 50 mm | 95 | 1.0 | 93.0 | 10$^9$ Ω/cm$^2$ | Exfoliated |
| Comparative Example 3 | 3H | 50 mm | 96 | 1.0 | 92.7 | Unmeasurable | Exfoliated |

1. Measurement of Pencil Hardness

A pencil hardness on the outermost surface of the antireflection hard coating film was measured using pencils by hardness (Mistubishi Pencil Co., Ltd.) under a load of 1 kg using a pencil hardness tester (Kipae E&T Co. Ltd.) in accordance with ASTM D3363.

2. Measurement of Curl Amount

The antireflection hard coating film was cut into a square of 10 cm×10 cm inclined at an angle of 45° to an MD direction and allowed to stand at 25° C., 50% for 12 hours under constant temperature and humidity conditions, and then the curling degree of each vertex was measured using a ruler.

Referring to Table 1, it was confirmed that the antireflection hard coating films according to the Examples of the present invention had a significantly better antistatic property than the antireflection hard coating films of the Comparative Examples.

In addition, it was confirmed that the Examples had significantly better hardness, anti-curling property, reflectance, and transmittance than the Comparative Examples.

According to the exemplary embodiments of the present invention, a hard coating layer having a water contact angle of 90° or less, a conductive layer, and a low refractive index layer are laminated. Thus, an antireflection hard coating film having improved interlayer bonding force between the hard coating layer and the conductive layer may be provided. In addition, the antireflection hard coating film may secure excellent hardness, anti-curling property, antistatic property, and antireflection property.

In addition, the hard coating layer includes an epoxy siloxane resin, a specific thermal initiator, and a photoinitiator to further improve the hardness and the anti-curling property of the antireflection hard coating film.

According to some exemplary embodiments, the composition for forming a hard coating layer may be sequentially photocured and thermally cured to form the hard coating layer, thereby further improving the hardness and the anti-curling property of the antireflection hard coating film.

In addition, the conductive layer may be formed by sputtering the conductive metal oxide or the conductive metal nitride, thereby further improving the hardness, the anti-curling property, and the antireflection property and securing the antistatic effect.

In addition, the low refractive index layer may be formed by sputtering an inorganic oxide, thereby improving the hardness, the anti-curling property, and antireflection property of the hard coating film.

The antireflection hard coating film according to some exemplary embodiments may further include an antifouling layer including a metal fluoride to exhibit excellent scratch resistance and antifouling performance.

What is claimed is:
1. An antireflection hard coating film comprising:
  a substrate;
  a hard coating layer having a water contact angle of 90° or less, disposed on the substrate;
  a conductive layer disposed on the hard coating layer; and
  a low refractive index layer disposed on the conductive layer,
  wherein the water contact angle of the hard coating layer is measured using a contact angle measuring instrument,
  wherein the antireflection hard coating film has a curl amount of 5 mm or less measured by cutting a 10 cm×10 cm square sample from the film inclined at an angle of 45° to a MD direction of the film and exposing the square sample to 25° C. and 50% humidity for 12 hours, wherein the curl amount is a maximum vertical height measured from a lowest position of the square sample to each vertex of the square sample,
  wherein the hard coating layer is a cured layer of a composition for forming a hard coating layer comprising an epoxy siloxane resin, a crosslinking agent, a thermal initiator including a compound represented by the following Chemical Formula 2, and a photoinitiator:

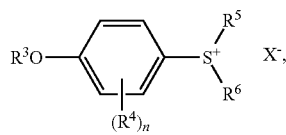

[Chemical Formula 2]

wherein $R^3$ is hydrogen, an alkoxycarbonyl group having 1 to 4 carbon atoms, an alkylcarbonyl group having 1 to 4 carbon atoms, or an arylcarbonyl group having 6 to 14 carbon atoms, $R^4$ is independently of each other hydrogen, halogen, or an alkyl group having 1 to 4 carbon atoms, n is 1 to 4, $R^5$ is an alkyl group having 1 to 4 carbon atoms or an aralkyl group having 7 to 15 carbon atoms which may be substituted by an alkyl group having 1 to 4 carbon atoms, $R^6$ is an alkyl group having 1 to 4 carbon atoms, and X is $SbF_6$, $PF_6$, $AsF_6$, $BF_4$, $CF_3SO_3$, $N(CF_3SO_2)_2$, or $N(C_6F_5)_4$,
  wherein the epoxy siloxane resin is prepared by hydrolysis and a condensation reaction of an alkoxysilane having an epoxy group
  represented by the following Chemical Formula 3:

$$R^7Si(OR^8)_3 \qquad \text{[Chemical Formula 3]},$$

wherein $R^7$ is a linear or branched alkyl group having 1 to 6 carbon atoms substituted by an epoxycycloalkyl group having 3 to 6 carbon atoms or substituted by an oxiranyl group, in which the alkyl group may include an ether group, $R^8$ is a linear or branched alkyl group having 1 to 7 carbon atoms,
  wherein the conductive layer includes any one or more selected from the group consisting of an aluminum (Al) oxide doped with any one or more selected from the group consisting of phosphorus (P), indium (In), and antimony (Sb); a titanium (Ti) oxide doped with any one or more selected from the group consisting of phosphorus, indium, and antimony; and an antimony oxide doped with any one or more selected from the group consisting of phosphorus and indium,
  wherein the crosslinking agent includes a compound represented by the following Chemical Formula 1:

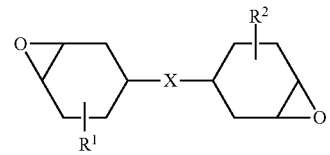

[Chemical Formula 1]

wherein $R^1$ and $R^2$ are independently of each other a linear or branched alkyl group having 1 to 5 carbon atoms, and X is a direct bond; a carbonyl group; a carbonate group; an ether group; a thio ether group; an ester group; an amide group; a linear or branched alkylene group, alkylidene group, or alkoxylene group having 1 to 18 carbon atoms; or a cycloalkylene group or cycloalkylidene group having 1 to 6 carbon atoms,
  wherein the substrate has a thickness of 10 to 250 μm and comprises at least one selected from the group consisting of a polyester-based resin a cellulose-based resin, a polycarbonate-based resin, an acrylic resin, a styrene-based resin, a polyolefin-based resin, a polyimide-based resin, a polyaramide-based resin, a polyamide-imide-based resin, a polyethersulfone-based resin and a sulfone-based resin,
  wherein the cured hard coating layer has a thickness of 5 to 100 μm, and
  wherein the epoxy siloxane resin is included at 20-70 parts by weight, the thermal initiator is included at 0.01-15 parts by weight, the photoinitiator is included at 0.01-10 parts by weight, and the crosslinker is included at 3-30 parts by weight, based on 100 parts by weight of the entire composition.

2. The antireflection hard coating film of claim 1, wherein the cured hard coating layer is formed by photocuring and then thermally curing the composition for forming a hard coating layer.

3. The antireflection hard coating film of claim 1, wherein the low refractive index layer includes an inorganic oxide.

4. The antireflection hard coating film of claim 3, wherein the inorganic oxide includes silicon dioxide ($SiO_2$).

5. The antireflection hard coating film of claim 1, wherein the antireflection hard coating film has a surface resistance of $10^7$ $\Omega/cm^2$ to $10^{13}$ $\Omega/cm^2$.

6. The antireflection hard coating film of claim 1, wherein the conductive layer has a refractive index of 1.6 to 2.6, and the low refractive index layer has a refractive index of 1.35 to 1.45.

7. The antireflection hard coating film of claim 1, wherein the hard coating layer has a refractive index of 1.48 to 1.55.

8. The antireflection hard coating film of claim 1, wherein when the conductive layer and the low refractive index layer are defined as an antireflection laminate, the antireflection laminate is laminated two to six times repeatedly.

9. The antireflection hard coating film of claim 1, further comprising: an antifouling layer including a metal fluoride, disposed on the low refractive index layer.

10. The antireflection hard coating film of claim 9, wherein the metal fluoride includes magnesium (Mg) or barium (Ba).

* * * * *